US011842957B2

(12) United States Patent
Jones et al.

(10) Patent No.: US 11,842,957 B2
(45) Date of Patent: Dec. 12, 2023

(54) AMPLIFIER MODULES AND SYSTEMS WITH GROUND TERMINALS ADJACENT TO POWER AMPLIFIER DIE

(71) Applicant: NXP USA, Inc., Austin, TX (US)

(72) Inventors: Jeffrey Kevin Jones, Chandler, AZ (US); Kevin Kim, Gilbert, AZ (US); Freek Egbert van Straten, Mook (NL); Ibrahim Khalil, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 582 days.

(21) Appl. No.: 17/136,304

(22) Filed: Dec. 29, 2020

(65) Prior Publication Data

US 2022/0208670 A1 Jun. 30, 2022

(51) Int. Cl.
*H01L 23/49* (2006.01)
*H01L 21/56* (2006.01)
(Continued)

(52) U.S. Cl.
CPC ........ *H01L 23/49838* (2013.01); *H01L 21/56* (2013.01); *H01L 23/367* (2013.01); *H01L 23/49811* (2013.01); *H01L 23/49822* (2013.01); *H01L 23/49833* (2013.01); *H01L 25/072* (2013.01); *H01L 25/18* (2013.01); *H01L 25/50* (2013.01); *H03F 1/30* (2013.01);
(Continued)

(58) Field of Classification Search
CPC .. H01L 23/49838; H01L 21/56; H01L 23/367
USPC ....................................................... 330/289
See application file for complete search history.

(56) References Cited

U.S. PATENT DOCUMENTS 7,755,186 B2 7/2010 Chiu et al.
9,899,292 B2 2/2018 Chiu et al.
(Continued)

FOREIGN PATENT DOCUMENTS

EP 3337037 A1 6/2018

OTHER PUBLICATIONS

Galkina, Nina; "60pcs TSSOP8 SSOP8 SOP8 To DIP8 Interposer Module PCB Board Adapter Plate"; retreived from the internet https://ninagalkina.blogspot.com/2019/08/60pcs-tssop8-ssop8-to-dip8.html ; 13 pages (Aug. 27, 2019).
(Continued)

*Primary Examiner* — Patricia T Nguyen
(74) *Attorney, Agent, or Firm* — Sherry W Gourlay

(57) ABSTRACT

An amplifier module includes a module substrate with a mounting surface, a signal conducting layer, a ground layer, and a ground terminal pad at the mounting surface. A thermal dissipation structure extends through the module substrate. A ground contact of a power transistor die is coupled to a surface of the thermal dissipation structure. Encapsulant material covers the mounting surface of the module substrate and the power transistor die, and a surface of the encapsulant material defines a contact surface of the amplifier module. A ground terminal is embedded within the encapsulant material. The ground terminal has a proximal end coupled to the ground terminal pad, and a distal end exposed at the contact surface. The ground terminal is electrically coupled to the ground contact of the power transistor die through the ground terminal pad, the ground layer of the module substrate, and the thermal dissipation structure.

19 Claims, 7 Drawing Sheets

(51) Int. Cl.

| | |
|---|---|
| *H01L 23/498* | (2006.01) |
| *H01L 23/367* | (2006.01) |
| *H01L 25/07* | (2006.01) |
| *H01L 25/18* | (2023.01) |
| *H01L 25/00* | (2006.01) |
| *H03F 1/30* | (2006.01) |
| *H03F 3/213* | (2006.01) |
| *H01L 23/31* | (2006.01) |
| *H01L 23/373* | (2006.01) |

(52) U.S. Cl.
CPC .......... *H03F 3/213* (2013.01); *H01L 23/3107* (2013.01); *H01L 23/3736* (2013.01); *H03F 2200/447* (2013.01)

(56) References Cited

U.S. PATENT DOCUMENTS

| | | | |
|---|---|---|---|
| 9,986,646 B2 | 5/2018 | Viswanathan et al. | |
| 2005/0224924 A1* | 10/2005 | Koh ................. | H01L 23/49562 |
| | | | 257/E23.044 |
| 2014/0240945 A1* | 8/2014 | Hosseini ................ | H01L 24/41 |
| | | | 438/107 |
| 2016/0150632 A1 | 5/2016 | Viswanathan et al. | |
| 2017/0085228 A1* | 3/2017 | Abdo ...................... | H01L 24/83 |
| 2019/0080973 A1 | 3/2019 | Otremba et al. | |
| 2019/0140598 A1* | 5/2019 | Schultz ................ | H04B 1/0458 |
| 2019/0343005 A1 | 11/2019 | Santos et al. | |
| 2022/0068817 A1* | 3/2022 | Li ..................... | H01L 23/53223 |

OTHER PUBLICATIONS

Meyer, Thorsten et al; "Automotive packaging trends: challenges and solutions"; Chip Scale Review; retreived from the Internet https://www.chipscalereview.com/blog/Automotive-packaging-trends:-challenges-and-solutions on Nov. 5, 2020; 14 pages.

Soga, Ikuo et al; "Thermal Management for Flip-chip High Power Amplifiers utilizing Carbon Nanotube Bumps"; IEEE Int'l Symposium on Radio-Frequency Integration Technology, Singapore, Singapore; 4 pages (Jan. 2009).

U.S. Appl. No. 16/851,895; not yet published; 48 pages (Apr. 17, 2020).

U.S. Appl. No. 16/852,064; not yet published; 40 pages (Apr. 17, 2020).

U.S. Appl. No. 17/077,583; not yet published; 48 pages (Oct. 22, 2020).

Yuen, Cindy et al; "A compact Flip Chip High Power Amplifier Module for Mobile Applications"; Proceedings of Asia-Pacific Microwave Conference 2010; 4 pages (2010).

* cited by examiner

AMPLIFIER MODULES AND SYSTEMS WITH GROUND TERMINALS ADJACENT TO POWER AMPLIFIER DIE

TECHNICAL FIELD

Embodiments of the subject matter described herein relate generally to amplifier modules, and more particularly to amplifier modules that include power transistor dies.

BACKGROUND

Wireless communication systems employ power amplifier modules for increasing the power of radio frequency (RF) signals. A power amplifier module includes a module substrate and amplifier circuitry coupled to a mounting surface of the module substrate. A typical module substrate also may include input and output (I/O) terminals on a bottom surface of the module (i.e., the surface opposite the module mounting surface), and conductive signal routing structures extending through and across the module substrate between the I/O terminals and bondpads at the mounting surface. Further one or more ground/thermal dissipation structures may extend through the module substrate between the mounting and bottom surfaces.

The amplifier circuitry often includes a power transistor die, which has at least one integrated power transistor with a bottom-side conductive ground layer. The bottom-side conductive ground layer of the power transistor die is directly connected to the surface(s) of the ground/thermal dissipation structure(s) that are exposed at the mounting surface of the module substrate. Along with functioning to remove heat from the power transistor die, the ground/thermal dissipation structure(s) may function to provide a ground reference to the power transistor die.

To convey RF signals between the module substrate and the power transistor die, electrical connections are made between the bondpads at the mounting surface of the module substrate and the I/O bondpads of the power transistor die. When the integrated power transistor is a field effect transistor (FET), the die's input bondpad connects to the gate terminal of the FET, and the die's output bondpad connects to the drain terminal of the FET. The source terminal of the FET is coupled through the die to the bottom-side, conductive ground layer, which in turn is connected to the ground/thermal dissipation structure(s) of the module substrate, as described above.

To integrate the above-described power amplifier module into a communication system, the module typically is coupled to a mounting surface of a system printed circuit board (PCB). More specifically, the module substrate bottom surface is connected to the top surface of the system PCB so that bottom-side module signal I/O terminals align with corresponding signal I/O pads on the PCB mounting surface. In addition, the module substrate is connected to the system PCB so that the module ground/thermal dissipation structure(s) contact a PCB heat spreader that extends through the system PCB. Accordingly, the combination of the module ground/thermal dissipation structure and the system PCB heat spreader may perform the dual function of providing a thermal pathway to remove heat generated by the power transistor die, and providing a ground reference to the power transistor die.

During operation, the power transistor amplifies input RF signals received through the transistor die input bondpad, and conveys the amplified RF signal to the transistor die output bondpad. All the while, heat generated by the power transistor die is dissipated through the ground/thermal dissipation structure(s) embedded in the module substrate and through the system PCB heat spreader, and a ground reference also is provided through the ground/thermal dissipation structure(s) and the system PCB heat spreader.

The above-described configuration works well for many applications. However, other applications may require a different configuration in which a thermal path for the heat produced by the power transistor die extends in a direction away from the system PCB, rather than through the system PCB. Such different configurations generate new challenges, however, including challenges associated with providing an adequate ground reference for the power transistor die.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter described herein include amplifier systems with a system substrate (e.g., a printed circuit board (PCB)) and a power amplifier module coupled to the system substrate. The power amplifier module includes a module substrate with an embedded heat dissipation structure, and a power amplifier die connected to the embedded heat dissipation structure. The power amplifier module is mounted to the system substrate in a "flipped orientation" with the embedded heat dissipation structure facing away from the system substrate, in contrast with conventional systems in which the embedded heat dissipation structure is coupled to a heat spreader in the system substrate. Accordingly, in an embodiment, a heat sink may be connected directly to the exposed surface of the embedded heat dissipation structure of the power amplifier module.

In such a system, proper grounding of the power amplifier die to the system substrate is important to achieve good performance. It is known that current (DC or RF) must travel in a closed loop. "Return current" is defined as the current flowing through a ground plane back to the source of the current. Current always takes the path that has the lowest "hurdle". For pure DC current, for example, that hurdle is resistance. In contrast, RF current tends to take the least inductive path. At higher frequencies, RF return current path optimization plays a significant role in power amplifier performance. More specifically, the return current path for the power amplifier die should be relatively short (in electrical length) to avoid significant reductions in efficiency, gain, or other performance metrics. As will be described in detail below, various embodiments of power amplifier modules are disclosed herein, which have grounding structures that provide a suitable ground/return current path for a power amplifier die of a power amplifier module that is mounted to a system PCB in a flipped orientation, as described above.

The power amplifier module embodiments described herein may be utilized to implement any of a variety of different types of power amplifiers. To provide a concrete example that will help to convey the details of the inventive subject matter, an example of a Doherty power amplifier module is utilized herein. However, those of skill in the art will understand, based on the description herein, that the inventive subject matter may be utilized in power amplifier modules that implement other types of amplifiers, as well. Accordingly, the use of a Doherty power amplifier in the example embodiments below is not meant to limit application of the inventive subject matter only to Doherty power amplifier modules, as the inventive subject matter may be used in other types of power amplifier modules, as well.

Figure 1:
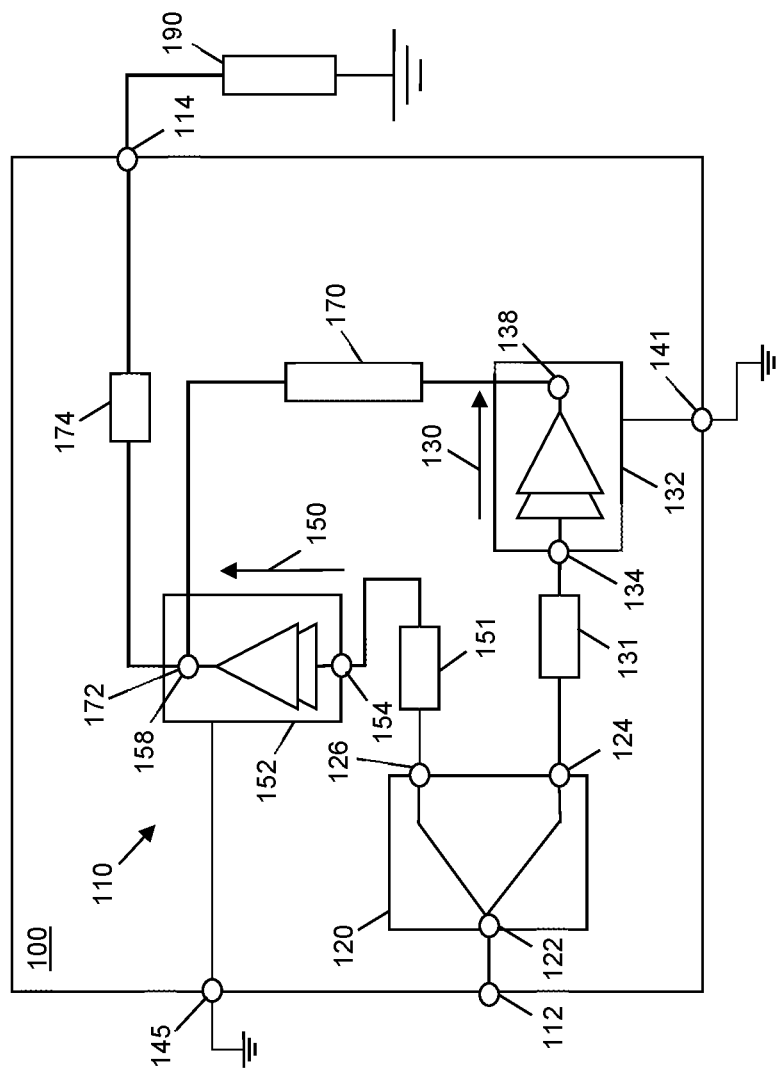
FIG. 1 is a schematic depiction of a Doherty power amplifier in a power amplifier module.

Prior to describing various physical implementations of power amplifier modules, reference is made to FIG. 1, which is a schematic depiction of a Doherty power amplifier 110 implemented in a power amplifier module 100. Power amplifier module 100 essentially includes a Doherty amplifier 110 implemented on a module substrate (e.g., module substrate 210, FIG. 2). Doherty amplifier 110 includes an RF input node 112, an RF output node 114, a power splitter 120, a carrier amplifier path 130 with one or more carrier amplifier dies (e.g., dies 233, 234, FIG. 2), a peaking amplifier path 150 with one or more peaking amplifiers (e.g., dies 253, 254, FIG. 2), a phase delay and impedance inversion element 170, and a combining node 172, in an embodiment. In addition, as will be discussed in more detail below, power amplifier module 100 also includes one or more ground terminals 141, 145, which are configured to provide an external ground reference to the power amplifier dies of the carrier and peaking amplifier paths 130, 150, according to various embodiments. As will be described in more detail below, the ground terminals 141, 145 are positioned in close proximity to the power amplifier dies in order to optimize the ground return loops for the dies, in accordance with various embodiments.

When incorporated into a larger RF system, the RF input node 112 is coupled to an RF signal source, and the RF output node 114 is coupled to a load 190 (e.g., an antenna or other load). The RF signal source provides an input RF signal, which is an analog signal that includes spectral energy that typically is centered around one or more carrier frequencies. Fundamentally, the Doherty amplifier 110 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126. According to an embodiment, the power splitter 120 includes a first phase shift element, which is configured to impart a first phase shift (e.g., about a 90 degree phase shift) to the peaking signal before it is provided to output 126. Accordingly, at outputs 124 and 126, the carrier and peaking signals may be about 90 degrees out of phase from each other.

When Doherty amplifier 110 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 110 has an asymmetrical configuration (i.e., a configuration in which one of the amplifier power transistors, typically the peaking amplifier transistor, is significantly larger), the power splitter 120 may output carrier and peaking signals having unequal power.

The outputs 124, 126 of the power splitter 120 are connected to the carrier and peaking amplifier paths 130, 150, respectively. The carrier amplifier path 130 is configured to amplify the carrier signal from the power splitter 120, and to provide the amplified carrier signal to the power combining node 172. Similarly, the peaking amplifier path 150 is configured to amplify the peaking signal from the power splitter 120, and to provide the amplified peaking signal to the power combining node 172, where the paths 130, 150 are designed so that the amplified carrier and peaking signals arrive in phase with each other at the power combining node 172.

According to an embodiment, the carrier amplifier path 130 includes an input circuit 131 (e.g., including an impedance matching circuit), a carrier amplifier 132 implemented using one or more carrier amplifier dies (e.g., dies 233, 234, FIG. 2), and a phase shift and impedance inversion element 170.

The carrier amplifier 132 includes an RF input terminal 134, an RF output terminal 138, and one or more amplification stages coupled between the input and output terminals 134, 138, in various embodiments. The RF input terminal 134 is coupled through input circuit 170 to the first output 124 of the power splitter 120, and thus the RF input terminal 134 receives the carrier signal produced by the power splitter 120.

Each amplification stage of the carrier amplifier 132 includes a power transistor. In a single-stage carrier amplifier 132, a single power transistor may be implemented on a single power amplifier die. In a two-stage carrier amplifier 132, two power transistors may be implemented on a single power amplifier die, or each power amplifier may be implemented on a separate die (e.g., dies 233, 234, FIG. 2), as will be exemplified in the power amplifier module depicted in FIG. 2.

Either way, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 134, one of the current-carrying terminals (e.g., the drain terminal) is electrically connected to the RF output terminal 138, and the other current-carrying terminal (e.g., the source terminal) is electrically connected to a ground reference (or another voltage reference). Conversely, a two-stage amplifier would include two power transistors coupled in series, where a first transistor functions as a driver amplifier transistor that has a relatively low gain, and a second transistor functions as a final-stage amplifier transistor that has a relatively high gain. In such an embodiment, the control terminal of the driver amplifier transistor is electrically connected to the RF input terminal 134, one of the current-carrying terminals of the driver amplifier transistor (e.g., the drain terminal) may be electrically connected to the control terminal of the final-stage amplifier transistor, and the other current-carrying terminal of the driver amplifier transistor (e.g., the source terminal) is electrically connected through an embodiment of a specialized ground terminal 141 to the ground reference (or another voltage reference). Additionally, one of the current-carrying terminals of the final-stage amplifier transistor (e.g., the drain terminal) is electrically connected to the RF output terminal 138, and the other current-carrying terminal of the final-stage amplifier transistor (e.g., the source terminal) may be electrically connected through an embodiment of a specialized ground terminal 141 to the ground reference (or another voltage reference). As will be explained in more detail in conjunction with FIGS. 2-4, the electrical connection of the carrier amplifier driver and/or final-stage amplifier transistors to the ground reference may be made using specialized ground terminals that are positioned close to the carrier amplifier transistors to provide a relatively short ground return path for the carrier amplifier.

In addition to the power transistor(s), portions of input and output impedance matching networks and bias circuitry (not illustrated in FIG. 1) also may be included within the carrier amplifier 132 and/or electrically coupled to the carrier amplifier 132. Further, in an embodiment in which the carrier amplifier 132 is a two-stage device, an interstage matching network (not illustrated in FIG. 1) also may be included within the carrier amplifier 132 between the driver and final-stage amplifier transistors.

The RF output terminal 138 of the carrier amplifier 132 is coupled to the power combining node 172 through phase shift and impedance inversion element 170, in an embodiment. According to an embodiment, the impedance inversion element is a lambda/4 ($\lambda/4$) transmission line phase shift element (e.g., a microstrip line), which imparts about a 90 degree relative phase shift to the carrier signal after amplification by the carrier amplifier 132. A first end of the impedance inversion element 170 is coupled to the RF output terminal 138 of the carrier amplifier 132, and a second end of the phase shift element 170 is coupled to the power combining node 172.

Reference is now made to the peaking amplifier path 150, which includes a peaking amplifier 152 and an input circuit 151 (e.g., including an impedance matching circuit), in an embodiment. The peaking amplifier 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120.

As with the carrier amplifier 132, each amplification stage of the peaking amplifier 152 includes a power transistor with a control terminal and first and second current-carrying terminals. The power transistor(s) of the peaking amplifier 152 may be electrically coupled between the RF input and output terminals 154, 158 in a manner similar to that described above in conjunction with the description of the carrier amplifier 132. Additional other details discussed with in conjunction with the description of the carrier amplifier 132 also apply to the peaking amplifier 152, and those additional details are not reiterated here for brevity. However, one important point to reiterate is that a current-carrying terminal of each peaking amplifier transistor (e.g., the source terminal of a driver and/or final-stage peaking amplifier transistor) may be electrically connected through an embodiment of a specialized ground terminal 145 to the ground reference (or another voltage reference), as described above in conjunction with the description of the carrier amplifier 132. As will be explained in more detail in conjunction with FIGS. 2-4, the electrical connection of the peaking amplifier driver and/or final-stage amplifier transistors to the ground reference may be made using specialized ground terminals that are positioned close to the peaking amplifier transistors to provide a relatively short ground return path for the peaking amplifier.

The RF output terminal 158 of the peaking amplifier 152 is coupled to the power combining node 172. According to an embodiment, the RF output terminal 158 of the peaking amplifier 152 and the combining node 172 are implemented with a common element. More specifically, in an embodiment, the RF output terminal 158 of the peaking amplifier 152 is configured to function both as the combining node 172 and as the output terminal 158 of the peaking amplifier 152. To facilitate combination of the amplified carrier and peaking signals, and as mentioned above, the RF output terminal 158 (and thus the combining node 172) is connected to the second end of the phase shift and impedance inversion element 170. In other embodiments, the combining node 172 may be a separate element from the RF output terminal 158.

Either way, the amplified carrier and peaking RF signals combine in phase at the combining node 172. The combining node 172 is electrically coupled to the RF output node 114 to provide the amplified and combined RF output signal to the RF output node 114. In an embodiment, an output impedance matching network 174 between the combining node 172 and the RF output node 114 functions to present proper load impedances to each of the carrier and peaking amplifier 132, 152. The resulting amplified RF output signal is produced at RF output node 114, to which an output load 190 (e.g., an antenna) is connected.

Amplifier 110 is configured so that the carrier amplifier path 130 provides amplification for relatively low level input signals, and both amplification paths 130, 150 operate in combination to provide amplification for relatively high level input signals. This may be accomplished, for example, by biasing the carrier amplifier 132 so that the carrier amplifier 132 operates in a class AB mode, and biasing the peaking amplifier 152 so that the peaking amplifier 152 operates in a class C mode.

In the embodiment illustrated in FIG. 1 and described above, a first phase shift element in splitter 120 imparts about 90 degrees of phase shift to the peaking signal prior to amplification, and phase shift and impedance inversion element 170 similarly imparts about 90 degrees of phase shift to the amplified carrier signal so that the amplified carrier and peaking signals may combine in phase at the combining node 172. Such an architecture is referred to as a non-inverted Doherty amplifier architecture. In an alternate embodiment, a first phase shift element in splitter 120 may impart about 90 degrees of phase shift to the carrier signal prior to amplification, rather than to the peaking signal, and phase shift and impedance inversion element 170 may be included instead at the output of the peaking amplifier. Such an alternate architecture is referred to as an inverted Doherty amplifier architecture. In still other alternate embodiments, other combinations of phase shift elements may be implemented in the carrier and/or peaking paths 130, 150 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 172.

Figure 2:
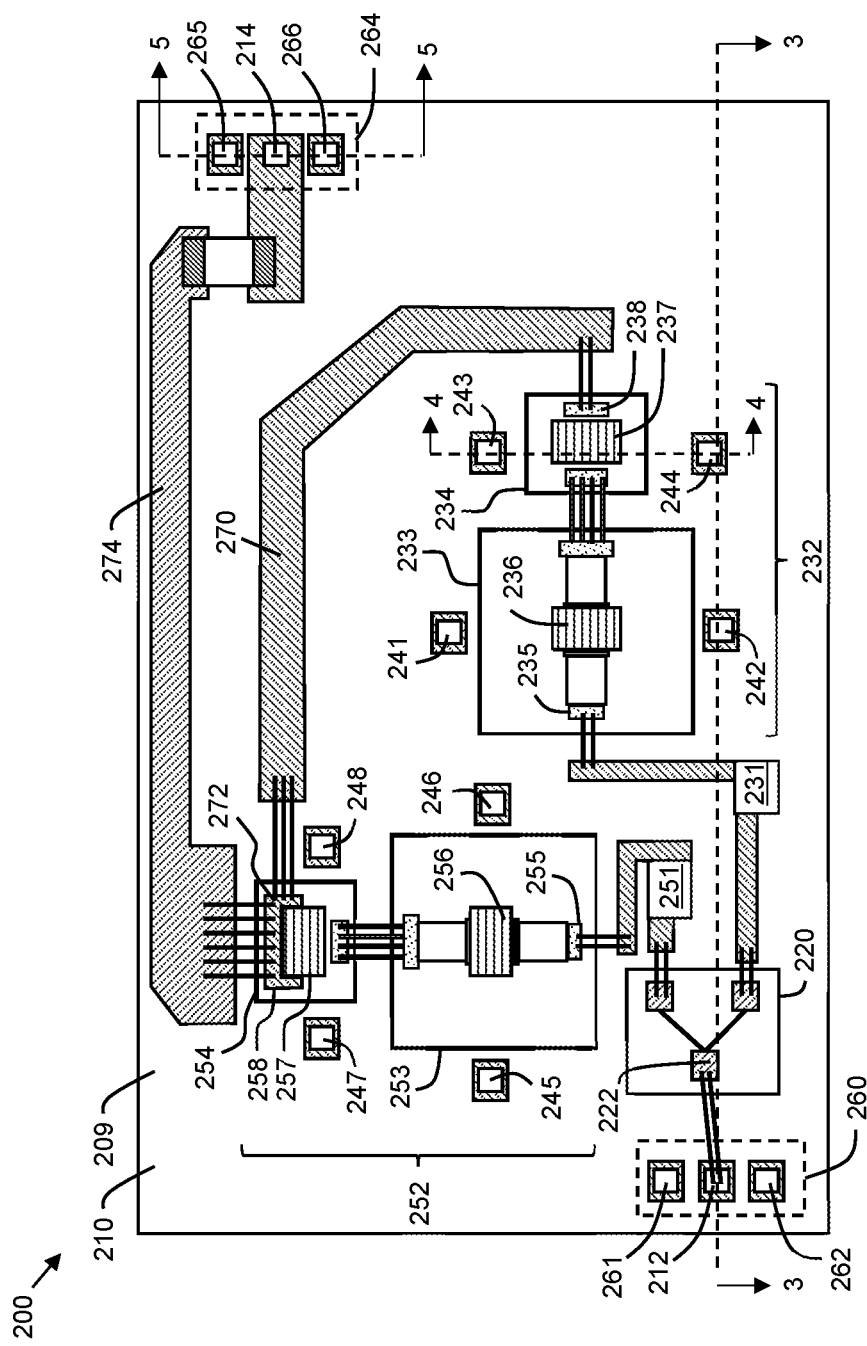
FIG. 2 is a top view of a power amplifier module that embodies the Doherty power amplifier of FIG. 1, in accordance with an example embodiment.

FIG. 2 is a top view of a power amplifier module 200 that embodies the Doherty amplifier circuitry of FIG. 1, in accordance with an example embodiment. To enhance understanding, FIG. 2 should be viewed simultaneously with FIG. 3, which is a cross-sectional, side view of the module 200 of FIG. 2 along line 3-3. Essentially, power amplifier module 200 includes a Doherty power amplifier (e.g., power amplifier 110, FIG. 1) implemented with a multi-layer module substrate 210 and a plurality of power transistor dies 233, 234, 253, 254 and other electrical components. Various components of power amplifier module 200 correspond with components depicted in FIG. 1, and it should be noted that corresponding components between FIG. 1 and FIGS. 2-3 have the same last two numerical digits (e.g., components 120 and 220 are corresponding components).

Figure 3:
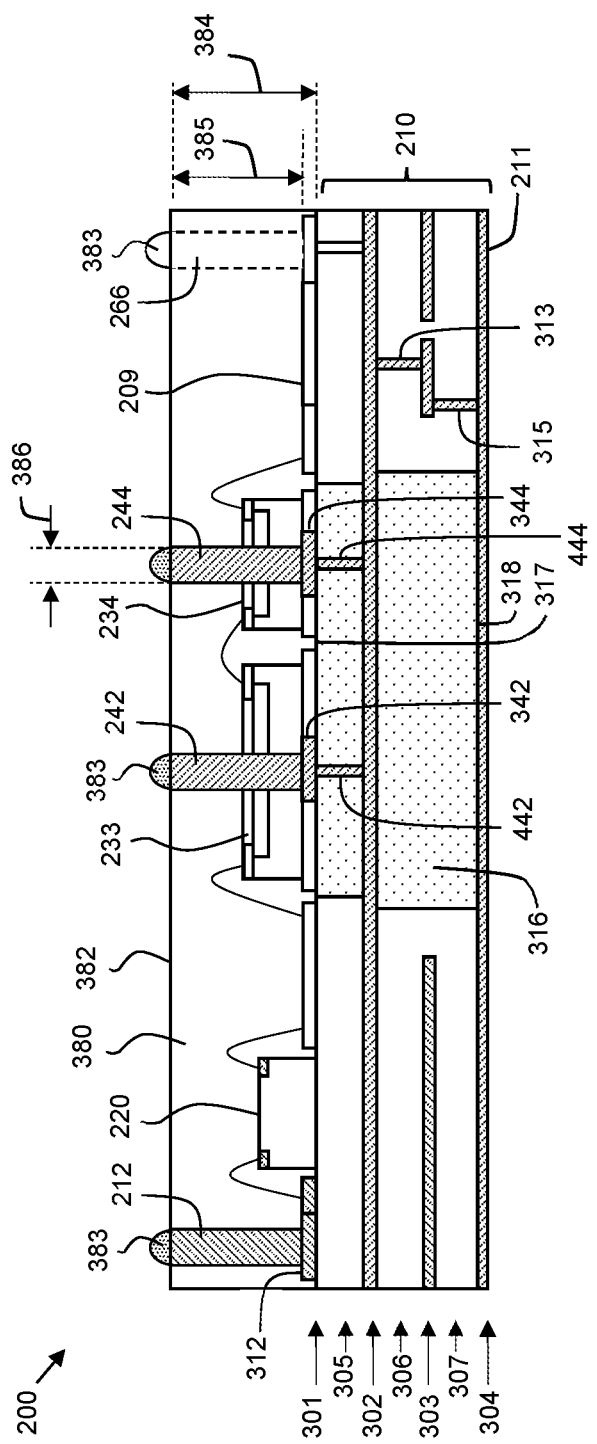
FIG. 3 is a cross-sectional, side view of the power amplifier module of FIG. 2 along line 3-3.

Power amplifier module 200 includes a module substrate 210 in the form of a multiple-layer printed circuit board (PCB) or other suitable substrate. The module substrate 210 has a top surface 209 (also referred to as a "mounting surface") and a bottom surface 211 (also referred to as a "heat sink attachment surface"). As will be described in more detail below, a plurality of components and terminals 212, 214, 241-248, 261, 262, 265, 266 are coupled to the mounting surface 209 of the module substrate 210, and non-conductive encapsulant material 380 (e.g., a plastic encapsulant) is disposed on the mounting surface 209 and over the components and terminals 212, 214, 241-248, 261, 262, 265, 266 to define a top surface 382 (also referred to as a "contact surface") of the module 200. As shown in FIG. 3, the encapsulant material 380 has a thickness 384 that is greater than the maximum height of the components (e.g., splitter 220 and power transistor dies 233, 234, 253, 254) covered by the encapsulant material 380.

As will also be described in more detail below, lower or proximal surfaces of the terminals 212, 214, 241-248, 261, 262, 265, 266 are coupled to conductive features on the mounting surface 209 of the module substrate 210, and upper or distal surfaces of the terminals 212, 214, 241-248, 261, 262, 265, 266 are exposed at the contact surface 382 of the encapsulant material 380. Conductive attachment material 383 (e.g., solder balls, solder paste, or conductive adhesive) is disposed on the exposed distal surfaces of the terminals 212, 214, 241-248, 261, 262, 265, 266 to facilitate electrical and mechanical attachment of the module 200 to a system substrate (e.g., system substrate 610, FIG. 6), as will be described in more detail later. Various features and embodiments of terminals 212, 214, 241-248, 261, 262, 265, 266 will be discussed later in more detail.

As depicted in FIG. 3, the module substrate 210 includes a plurality of dielectric layers 305, 306, 307 (e.g., formed from FR-4, ceramic, or other PCB dielectric materials), in an alternating arrangement with a plurality of conductive layers 301, 302, 303, 304, where a top surface 209 of the module substrate 210 is defined by a patterned conductive layer 301, and a bottom surface 211 of the module substrate 210 is defined by a conductive layer 304. It should be noted that, although module substrate 210 is shown to include three dielectric layers 305-307 and four conductive layers 301-304, other embodiments of a module substrate may include more or fewer dielectric layers and/or conductive layers.

Each of the various conductive layers 301-304 may have a primary purpose, and also may include conductive features that facilitate signal and/or voltage/ground routing between other layers. Although the description below indicates a primary purpose for each of the conductive layers 301-304, it should be understood that the layers (or their functionality) may be arranged differently from the particular arrangement best illustrated in FIG. 3 and discussed below.

For example, in an embodiment, the patterned conductive layer 301 at the mounting surface 209 of the module substrate 210 may primarily function as a signal conducting layer. More specifically, layer 301 includes a plurality of conductive features (e.g., conductive pads and traces) which serve as attachment points for dies 233, 234, 253, 254 and other discrete components, and also provide electrical connectivity between the dies 233, 234, 253, 254 and the other discrete components. In addition, as will be discussed below, layer 301 may include a plurality of conductive pads (e.g., signal terminal pad 312 and ground terminal pads 342, 344, 366) that are specifically designated for attachment of electrically conductive signal and/or ground terminals 212, 214, 241-248, 261, 262, 265, 266, which will be described in more detail in conjunction with FIGS. 4 and 5.

A second patterned conductive layer 302 functions as an RF ground layer. The RF ground layer 302 also includes a plurality of conductive features (e.g., conductive traces), which may be electrically coupled to conductive features of the signal conducting layer 301 and to a system ground layer 304 (described below) with conductive vias 311, 313, 315 that extend through the dielectric layers 305-307. For example, conductive ground terminal pads 342, 344, 366 are electrically coupled through vias 311 to the RF ground layer 302, and the RF ground layer 302 is, in turn, electrically coupled through vias 313, 315 (and routing features of conductive layer 303) to the system ground layer 304.

A third patterned conductive layer 303 functions to convey bias voltages to power transistors 236, 237, 256, 257 within the dies 233, 234, 253, 254, and also may function as a routing layer, as mentioned above. Finally, a fourth conductive layer 304 functions as a system ground layer and also as a heat sink attachment layer, as will be explained in more detail in conjunction with FIG. 6.

According to an embodiment, module substrate 210 also includes one or more thermal dissipation structures 316, which extend between the top and bottom surfaces 209, 211 of the module substrate 210. The dies 233, 234, 253, 254 are physically and electrically coupled to surfaces 317 of the thermal dissipation structures 316 that are exposed at the top surface 209 of the module substrate 210. The bottom surfaces 318 of the thermal dissipation structures 316 may be exposed at the bottom surface 211 of the module substrate 210, or the bottom surfaces 318 of the thermal dissipation structures 316 may be covered with the bottom conductive layer 304, as shown in FIG. 3. Either way, the thermal dissipation structures 316 are configured to provide a thermal pathway between the dies 233, 234, 253, 254 and the bottom surfaces 318 of the thermal dissipation structures 316 (and thus the bottom surface 211 of the module substrate 210). In various embodiments, the thermal dissipation structures 316 may include conductive metallic coins that are press-fit and/or attached into through-holes that extend between the surfaces 209, 211 of the module substrate 210. In alternate embodiments, each of the thermal dissipation structures 316 may include a plurality (or set) of conductive thermal vias (e.g., circular or bar vias) that extend between the surfaces 209, 211 of the module substrate 210. As will be described in more detail in conjunction with FIG. 6, the surfaces 318 of the thermal dissipation structures 316 (or the portion of the conductive layer 304 overlying those surfaces 318) are physically and thermally coupled to a heat sink (e.g., heat sink 616, FIG. 6) when the module 200 is integrated within a larger electrical system.

The power amplifier module 200 further includes an RF signal input terminal 212 (e.g., RF input node 112, FIG. 1), a power splitter 220 (e.g., power splitter 120, FIG. 1), a two-stage, carrier amplifier 232 (e.g., amplifier 132, FIG. 1), a two-stage peaking amplifier 252 (e.g., amplifier 152, FIG. 1), various phase shift and impedance matching elements, a combining node 272 (e.g., combining node 172, FIG. 1), an output impedance matching network 274 (e.g., network 174, FIG. 1), and an RF signal output terminal 214 (e.g., RF output node 114, FIG. 1).

Terminal 212 functions as the RF signal input terminal for the module 200, and is coupled to an RF signal input pad 312 at the top surface 209 of the module substrate 210. Through one or more conductive structures (e.g., vias, traces, and/or wirebonds, as shown), the RF signal input pad 312 is electrically coupled to an input 222 to the power splitter 220.

The power splitter 220, which is coupled to the mounting surface 209 of the system substrate 210, may include one or more discrete die and/or components, although it is represented in FIG. 2 as a single element. The power splitter 220 includes an input terminal 222 and two output terminals (not numbered, but corresponding to terminals 124, 126, FIG. 1). The input terminal 222 is electrically coupled through one or more conductive structures (e.g., vias, traces, and/or wirebonds, as shown) to the RF signal input pad 312 and to the RF signal input terminal 212, and thus is configured to receive an input RF signal. The output terminals of the power splitter 220 are electrically coupled through one or more conductive structures (e.g., vias, traces, and/or wirebonds) and input circuits 231, 251 (e.g., input circuits 131, 151, FIG. 1) to inputs 235, 255 for the carrier and peaking amplifiers 232, 252, respectively.

The power splitter 220 is configured to split the power of the input RF signal received through the RF input terminal 212 into first and second RF signals, which are produced at the output terminals of the power splitter 220. In addition, the power splitter 220 may include one or more phase shift elements configured to impart about a 90 degree phase difference between the RF signals provided at the splitter output terminals. The first and second RF signals produced at the outputs of the power splitter 220 may have equal or unequal power, as described previously.

The first output of the power splitter is electrically coupled to a carrier amplifier path (i.e., to the carrier amplifier 232), and the second output of the power splitter is electrically coupled to a peaking amplifier path (i.e., to the peaking amplifier 252). The RF signal produced at the second power splitter output may be delayed by about 90 degrees from the RF signal produced at the first power splitter output. In other words, the RF signal provided to the peaking amplifier path may be delayed by about 90 degrees from the RF signal provided to the carrier amplifier path. In any event, the first RF signal produced by the power splitter 220 is amplified through the carrier amplifier path 232, and the second RF signal produced by the power splitter 220 is amplified through the peaking amplifier path 252.

In the specific embodiment of FIG. 2, each of the carrier and peaking amplifier paths includes a two-stage power amplifier 232, 252, where a driver amplifier transistor 236, 256 is implemented on a driver amplifier die 233, 253, and a final-stage amplifier transistor 237, 257 is implemented on a separate final-stage amplifier die 234, 254. For example, each of the transistors 236, 237, 256, 257 may be field effect transistors (FETs), such as laterally-diffused metal oxide semiconductor (LDMOS) FETs or high electron mobility transistors (HEMTs). The description and claims may refer to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

The carrier amplifier 232 more specifically includes a silicon driver stage die 233 and a gallium nitride (GaN) final-stage die 234, and the peaking amplifier 252 also includes a silicon driver stage die 253 and a GaN final-stage die 254, in accordance with an example embodiment. In other embodiments, each of the carrier and peaking amplifiers 232, 252 may include a two-stage power amplifier implemented on a single die, or each of the carrier and peaking amplifiers 232, 252 may include a single-stage power amplifier implemented on a single die. In still other embodiments, each of the carrier and peaking amplifiers may include a two-stage power amplifier implemented on separate driver and final-stage dies, but the driver and final-stage dies may be formed using the same semiconductor technology (e.g., both the driver and final-stage dies are silicon dies or GaN dies), or the driver and/or final-stage dies may be formed using different semiconductor technologies than those described above (e.g., the driver and/or final-stage dies may be formed from silicon germanium (SiGe) and/or gallium arsenide (GaAs) die).

The carrier amplifier path includes the above-mentioned driver stage die 233, the final-stage die 234, and a phase shift and impedance inversion element 270 (e.g., element 170, FIG. 1). The driver stage die 233 and the final-stage die 234 of the carrier amplifier path 232 are electrically coupled together in a cascade arrangement between an input terminal 235 of the driver stage die 233 (corresponding to a carrier amplifier input) and an output terminal 238 of the final-stage die 234 (corresponding to a carrier amplifier output).

The driver stage die 233 includes a plurality of integrated circuits. In an embodiment, the integrated circuitry of die 233 includes a series-coupled arrangement of the input terminal 235 (e.g., input terminal 135, FIG. 1), an input impedance matching circuit (not numbered), a silicon power transistor 236, an integrated portion of an interstage impedance matching circuit (not numbered), and an output terminal not numbered, in an embodiment. More specifically, the gate of the transistor 236 is electrically coupled through the input impedance matching circuit to the input terminal 235, and the drain of the transistor 236 is electrically coupled through the output impedance matching circuit to the output terminal of die 233. The source of transistor 236 is electrically coupled to a conductive layer (or source terminal, such as source contact 434, FIGS. 4A, 4B) on a bottom surface of die 233, and the bottom conductive layer is physically, electrically, and thermally coupled to the exposed top surface 317 of a thermal dissipation structure 316.

The output terminal of the driver stage die 233 is electrically coupled to the input terminal of the final-stage die 234 through a wirebond array (not numbered) or another type of electrical connection. The final-stage die 234 also includes a plurality of integrated circuits. In an embodiment, the integrated circuitry of die 234 includes a series-coupled arrangement of an input terminal (not numbered), a GaN power transistor 237, and an output terminal 238 (e.g., output terminal 138, FIG. 1). More specifically, the gate of the transistor 237 is electrically coupled to the input terminal of die 234, and the drain of the transistor 237 is electrically coupled to the output terminal 238 of die 234. The source of transistor 237 is electrically coupled to a conductive layer on a bottom surface of die 234, and the bottom conductive layer is physically, electrically, and thermally coupled to the exposed top surface 317 of a thermal dissipation structure 316.

The peaking amplifier path includes the above-mentioned driver stage die 253 and the final-stage die 254. The driver stage die 253 and the final-stage die 254 of the peaking amplifier path 252 are electrically coupled together in a cascade arrangement between an input terminal 255 of the driver stage die 253 (corresponding to a peaking amplifier input) and an output terminal 258 of the final-stage die 254 (corresponding to a peaking amplifier output).

The driver stage die 253 includes a plurality of integrated circuits. In an embodiment, the integrated circuitry of die 253 includes a series-coupled arrangement of the input terminal 255 (e.g., input terminal 155, FIG. 1), an input impedance matching circuit (not numbered), a silicon power transistor 256, an integrated portion of an interstage impedance matching circuit (not numbered), and an output terminal not numbered, in an embodiment. More specifically, the gate of the transistor 256 is electrically coupled through the input impedance matching circuit to the input terminal 255, and the drain of the transistor 256 is electrically coupled through the output impedance matching circuit to the output terminal of die 253. The source of transistor 256 is electrically coupled to a conductive layer on a bottom surface of die 253, and the bottom conductive layer is physically, electrically, and thermally coupled to the exposed top surface of a thermal dissipation structure (e.g., similar or identical to thermal dissipation structure 316).

The output terminal of the driver stage die 253 is electrically coupled to the input terminal of the final-stage die 254 through a wirebond array (not numbered) or another type of electrical connection. The final-stage die 254 also includes a plurality of integrated circuits. In an embodiment, the integrated circuitry of die 254 includes a series-coupled arrangement of an input terminal (not numbered), a GaN power transistor 257, and an output terminal 258 (e.g., output terminal 158, FIG. 1). More specifically, the gate of the transistor 257 is electrically coupled to the input terminal of die 254, and the drain of the transistor 257 is electrically coupled to the output terminal 258 of die 254. The source of transistor 257 is electrically coupled to a conductive layer on a bottom surface of die 254, and the bottom conductive layer is physically, electrically, and thermally coupled to the exposed top surface of a thermal dissipation structure.

An amplified carrier signal is produced at the output terminal 238 of the final-stage die 234, and an amplified peaking signal is produced at the output terminal 258 of the final-stage die 254, which also functions as the combining node 272 (e.g., node 172, FIG. 1) for the amplifier. According to an embodiment, the output terminal 238 of the carrier final-stage die 234 is electrically coupled (e.g., through wirebonds (not numbered) or another type of electrical connection) to a first end of the phase shift and impedance inversion element 270, and the output terminal 258 of the peaking final-stage die 254 is electrically coupled (e.g., through wirebonds (not numbered) or another type of electrical connection) to a second end of the phase shift and impedance inversion element 270.

According to an embodiment, the phase shift and impedance inversion element 270 may be implemented with a quarter-wavelength or lambda/4 ($\lambda$/4) or shorter transmission line (e.g., a microstrip transmission line with an electrical length up to about 90 degrees) that is formed from a portion of the conductive layer 301. As used herein, lambda is the wavelength of an RF signal at the fundamental frequency of operation of the amplifier (e.g., a frequency in a range of about 600 megahertz (MHz) to about 10 gigahertz (GHz) or higher). The combination of the phase shift and impedance inversion element 270 and the wirebond (or other) connections to the output terminals 238, 258 of dies 234, 254 may impart about a 90 degree relative phase shift to the amplified carrier signal as the signal travels from output terminal 238 to output terminal 258/combining node 272. When the various phase shifts imparted separately on the carrier and peaking RF signals through the carrier and peaking paths, respectively, are substantially equal, the amplified carrier and peaking RF signals combine substantially in phase at output terminal 258/combining node 272.

The output terminal 258/combining node 272 is electrically coupled (e.g., through wirebonds or another type of electrical connection) through an output impedance matching network 274 (e.g., network 174, FIG. 1) to RF output terminal 214 (e.g., node 114, FIG. 1). The output impedance matching network 274 functions to present the proper load impedances to each of carrier and peaking final-stage dies 234, 254. Although shown in a highly simplified form in FIG. 2, the output impedance matching network 274 may include various conductive traces, additional discrete components (e.g., capacitors, inductors, and/or resistors) between output terminal 258/combining node 272 and RF output terminal 214, which provide the desired impedance matching.

As discussed previously, a plurality of terminals 212, 214, 241-248, 261, 262, 265, 266 are coupled to the mounting surface 209 of the module substrate 210, and non-conductive encapsulant material 380 is disposed on the mounting surface 209 and around the terminals 212, 214, 241-248, 261, 262, 265, 266 to define a contact surface 382 of the module 200. Certain ones of the terminals 212, 214 correspond to signal I/O terminals, and other ones of the terminals 241-248, 261, 262, 265, 266 correspond to embodiments of ground terminals. Although not shown in FIG. 2, additional terminals for providing bias voltages (e.g., gate and/or drain bias voltages) to the transistors 236, 237, 246, 247 also may be coupled to the mounting surface 209.

Figure 4A:
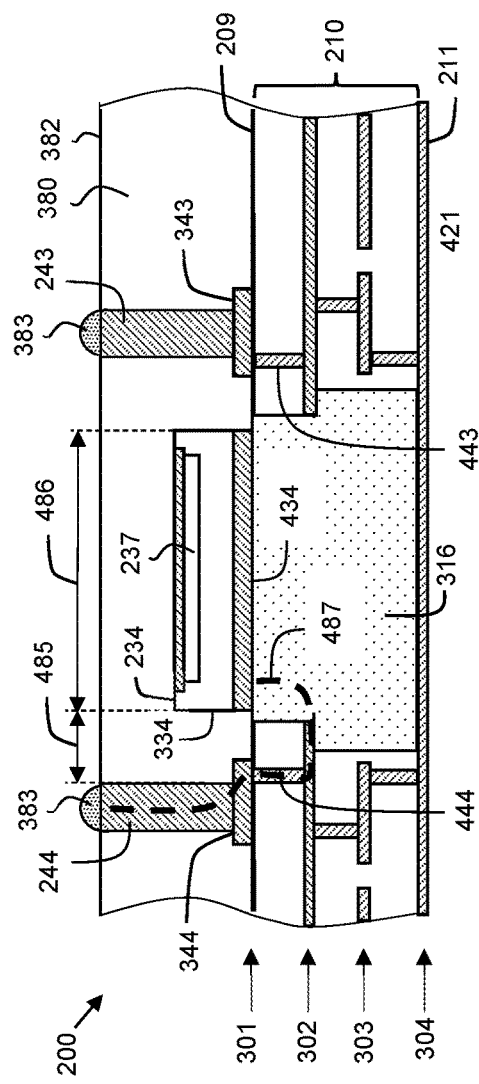
FIGS. 4A and 4B are cross-sectional, side views of two different example embodiments of the power amplifier module of FIG. 2 along line 4-4.
Figure 5A:
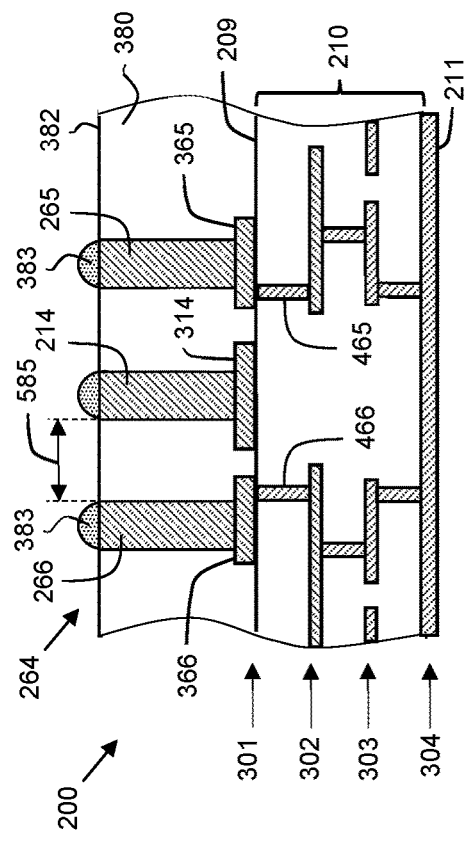
FIGS. 5A, 5B, and 5C are cross-sectional, side views of three different example embodiments of the power amplifier module of FIG. 2 along line 5-5.

A first embodiment of terminals 212, 214, 241-248, 261, 262, 265, 266 is depicted in detail in FIGS. 3, 4A, and 5A. As with FIG. 3, FIGS. 4A and 5A are cross-sectional, side views of power amplifier module 200 of FIG. 2 along lines 4-4 and 5-5, respectively.

More specifically, the cross-sections of FIGS. 3, 4A, and 5A cut through terminals 212, 214, 242-244, 265, and 266, where terminals 212 and 214 are signal terminals, and terminals 242-244, 265, and 266 are ground terminals. Regardless of their type, each terminal 212, 214, 241-248, 261, 262, 265, 266 is connected to a terminal pad (e.g., terminal pads 312, 314, 342, 343, 344, 365, 366) at the mounting surface 209 of the module substrate 210, and each terminal pad is formed from a portion of the patterned conductive layer 301. Signal terminals 212, 214 are configured to convey RF signals, and accordingly the signal terminals 212, 214 and their associated signal terminal pads 312, 314 are electrically coupled to conductive traces formed from portions of signal conducting layer 301. In contrast, ground terminals 241-248, 261, 262, 265, 266 are configured to provide a connection between the RF ground layer 302 and an external ground (e.g., ground layer 602 of system substrate 610, FIG. 6), and accordingly those ground terminals and their associated ground terminal pads (e.g., pads 342, 343, 344, 365, 366) are electrically coupled through conductive vias (e.g., vias 442, 443, 444, 465, 466) to the RF ground layer 302. As best shown in FIG. 4A, the RF ground layer 302, in turn, is electrically coupled to the thermal dissipation structures (e.g., structure 316) to which the dies 233, 234, 253, 254 are connected, and accordingly, the combination of the thermal dissipation structure 316, the RF ground layer 302, vias 442, 443, 444, 465, 466, ground terminal pads 342, 343, 344, 365, 366, and ground terminals 241-248, 261, 262, 265, 266 provide an electrically-conductive path between the power transistor dies 233, 234, 253, 254 and the contact surface 382 of the module 200.

According to a particular embodiment, as best depicted in FIGS. 3 and 4A, at least some of the ground terminals 241-248 are positioned adjacent to and "in close proximity" to one or more sides of the power transistor dies 233, 234, 253, 254. As used herein, the phrase "in close proximity", in the above context, means that a physical distance (e.g., distance 485, FIG. 4A) between a side (e.g., side 334, FIG. 4A) of a power transistor die (e.g., die 234) and a side of a ground terminal (e.g., ground terminal 244) is less than the width (e.g., width 486, which is the die dimension parallel to distance 485) of the die to which the ground terminal is adjacent. In addition or alternatively, the phrase "in close proximity", in the above context, means that an electrical length of an electrically conductive path (e.g., dashed-line path 487) between the ground contact for the die (e.g., the bottom-side source contact 434) through the thermal dissipation structure (e.g., structure 316), the RF ground layer (e.g., layer 302), any intervening vias (e.g., via 444), the ground terminal pad (e.g., pad 344), and the height of the ground terminal (e.g., terminal 244) is less than about lambda/5 ($\lambda/5$), in some embodiments, or less than about lambda/16 ($\lambda/16$), in other embodiments. Although FIG. 2 illustrates the ground terminals 241-248 having been positioned at specific locations on the mounting surface 209 of the module substrate 210, the ground terminals 241-248 may be positioned at additional and/or different locations, as well. More specifically, it is desirable that the ground terminals be positioned so that their ultimate effect may be to minimize or substantially eliminate the RF return current spreading across the module substrate 210, which may otherwise have peak current areas similar to standing waves.

As will be explained in more detail in conjunction with FIG. 6, positioning the ground terminals 241-248 in close proximity to the power transistor dies 233, 234, 253, 254 facilitates a relatively short return-current loop for the dies 233, 234, 253, 254, once the module 200 is mounted to a system substrate (e.g., system substrate 610, FIG. 6) and rendered operational. This configuration avoids potential detrimental performance issues that may otherwise occur for systems in which relatively long return-current loops are implemented.

According to another particular embodiment, as best depicted in FIGS. 3 and 5A, at least some other ground terminals 261, 262, 265, 266 are positioned on both sides of and "in close proximity" to a signal terminal 212, 214, in order to provide a GSG (ground-signal-ground) terminal structure 260, 264 for the RF input and RF output of the module 200. As used herein, the phrase "in close proximity", in the above context, means that a physical distance (e.g., distance 585, FIG. 5A) between a side of a ground terminal (e.g., ground terminal 265 or 266) and a nearest side of a signal terminal (e.g., signal terminal 214) is less than twice the width of the signal terminal 212, 214. By implementing a GSG terminal structure for the RF input and RF output of the module 200, the length of the return current loop associated with the terminal structure may be very short. In addition, radiated electromagnetic energy from the signal terminals 212, 214 may be terminated to ground by the proximate ground terminals 261, 262, 265, 266, which avoids potential performance issues that may otherwise occur when the radiated electromagnetic energy is permitted to reach other portions of the module.

In the embodiments illustrated in FIGS. 3, 4A, and 5A, each signal and ground terminal 214, 216, 241-248, 261, 262, 264, 265 includes a rigid conductive terminal pillar or post, with a proximal end directly connected to a respective terminal pad (e.g., terminal pads 312, 314, 342, 343, 344, 365, 366), and a distal end exposed at the contact surface 382 of the module 200. According to an embodiment, the pillars for the signal and ground terminals 214, 216, 241-248, 261, 262, 264, 265 are formed from a highly conductive material, such as copper or another suitable conductive metal. The pillars may be pre-formed and attached to the signal and ground terminals 214, 216, 241-248, 261, 262, 264, 265 using solder, conductive adhesive, sintering, brazing, or other suitable materials and methods. In other embodiments, the pillars may be formed in-situ on the signal and ground terminals 214, 216, 241-248, 261, 262, 264, 265.

As shown in FIG. 2, each of the terminal pillars may have a square or rectangular cross-section, in some embodiments, although the terminal pillars alternatively may have circular or bar-shaped cross-sections, in other embodiments. For example, when the terminal pillars have square or circular cross-sections, the terminal pillars may have a width 386 (or diameter) in a range of about 300 microns to about 800 microns (e.g., about 500 microns), although the width 386 may be smaller or larger, as well. The height 385 of the terminal pillars may be in a range of about 500 microns to about 1500 microns (e.g., about 1000 microns), for example, although the terminal pillars may be shorter or taller, as well. According to an embodiment, the height 385 of the terminal pillars may be approximately equal to the thickness 384 of the encapsulant material 380, so that the distal ends of the terminal pillars may be substantially co-planar with the contact surface 382 of the module 200. In other embodiments, the distal ends of the signal and ground terminal pillars may be recessed below or extend above the contact surface 382 of the module 200. Either way, the distal ends of the signal and ground terminal pillars are exposed at the contact surface 382, and the conductive attachment material 383 on the distal ends enables the module 200 to be physically and electrically connected to a system substrate (e.g., system substrate 610, FIG. 6).

FIGS. 3, 4A, and 5A depict signal and ground terminals 214, 216, 241-248, 261, 262, 264, 265 that include conductive pillars that are embedded in the encapsulant material of the module 200. In an alternate embodiment, as illustrated in FIGS. 4B, 5B, and 5C, the signal and ground terminals 214, 216, 241-248, 261, 262, 264, 265 instead may be implemented in the form of small interposer structures that are attached to the signal and ground terminal pads (e.g., terminal pads 312, 314, 342, 343, 344, 365, 366) prior to overmolding the module substrate 210 and components with the encapsulant material 380.

Figure 4B:
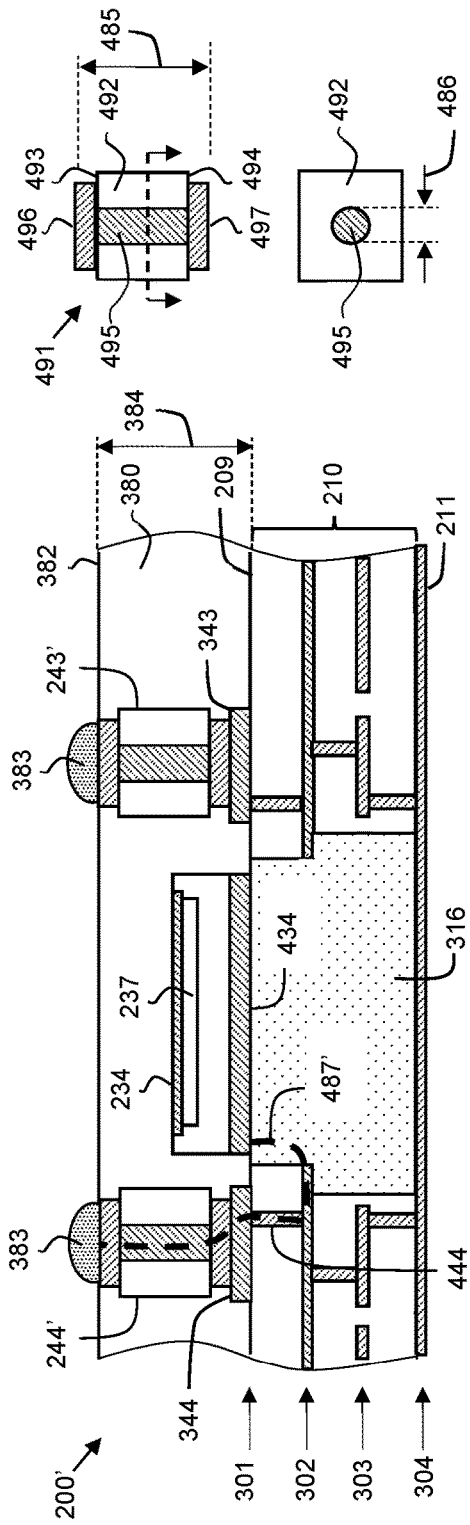
Figure 5C:
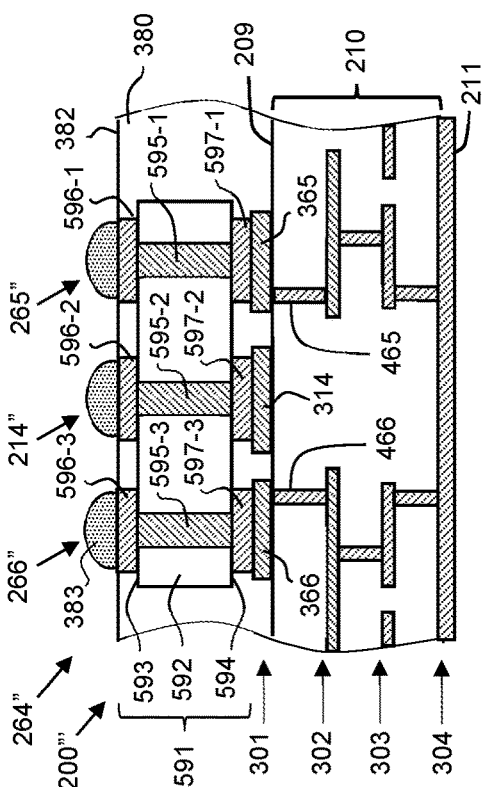
Figure 5B:
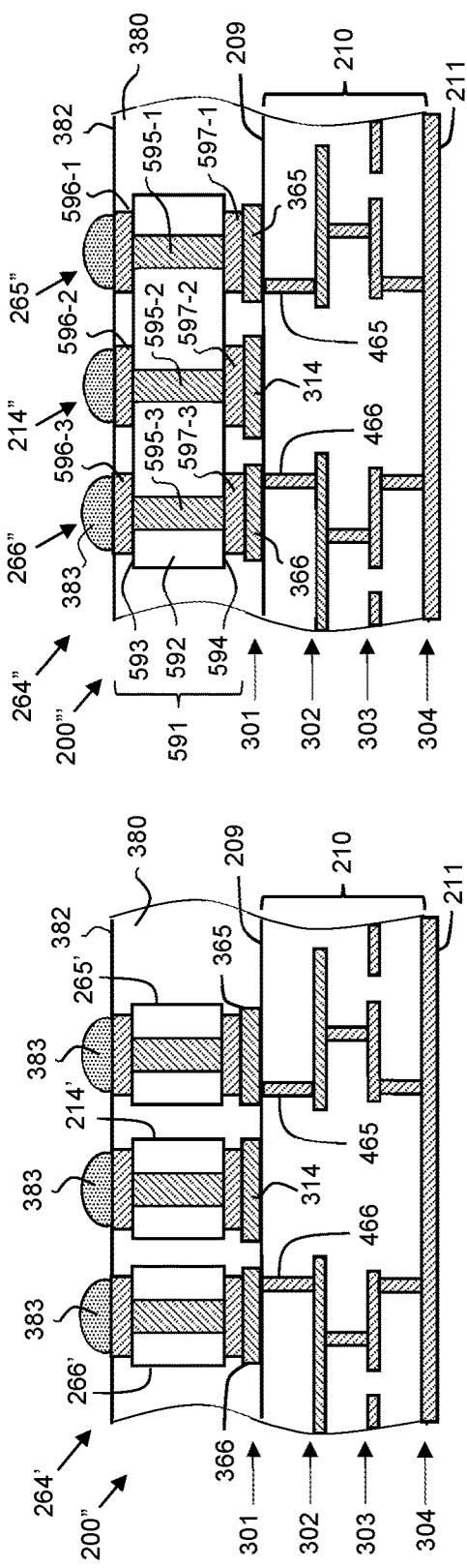

For example, FIG. 4B is a cross-sectional, side view of a modified version 200' of the power amplifier module 200 of FIG. 2 along line 4-4, which includes interposer ground terminals 243', 244' positioned on both sides of power transistor die 234 according to another example embodiment. Similarly, FIG. 5B which is a cross-sectional, side view of a modified version 200" of the power amplifier module 200 of FIG. 2 along line 5-5, which includes interposer ground terminals 265', 266' positioned on both sides of an interposer signal terminal 214' according to another example embodiment.

On the right side of FIG. 4B, two cross-sectional views of a "generic" interposer terminal 491 are shown (i.e., an interposer terminal that may be used for any or all of the signal and ground terminals of the module 200). As shown in the side, cross-sectional view (top drawing on the right side of FIG. 4B), the interposer terminal 491 includes a dielectric body 492 (e.g., formed from FR-4, ceramic, or other suitable dielectric materials) with top and bottom surfaces 493, 494, and a conductive via 495 extending through the dielectric body 492 between its top and bottom surfaces 493, 494. In addition, conductive pads 496, 497 are deposited on the top and bottom surfaces 493, 494 in contact with first and second ends, respectively, of the conductive via 495. The top-down, cross-sectional view (bottom drawing on the right side of FIG. 4B) shows that the conductive via 495 may have a circular cross-sectional shape. However, in other embodiments, the conductive via 495 alternatively may have a square, rectangular, or bar shape. Either way, the interposer terminal 491 provides a conductive path between pads 496, 497 through via 495.

When the via 495 has a square or circular cross-section, the via 495 may have a width 486 (or diameter) in a range of about 300 microns to about 800 microns (e.g., about 500 microns), although the width 486 may be smaller or larger, as well. The height 485 of the interposer terminal 491 may be in a range of about 500 microns to about 1500 microns (e.g., about 1000 microns), for example, although the interposer terminal may be shorter or taller, as well. According to an embodiment, the height 485 of the interposer terminal 491 may be approximately equal to the thickness 384 of the encapsulant material 380, so that the top conductive pad 496 of each interposer terminal may be substantially co-planar with the contact surface 382 of the module 200'. In other embodiments, the top conductive pad 496 of each interposer terminal may be recessed below or extend above the contact surface 382 of the module 200'. Either way, the top conductive pad 496 of each interposer terminal is exposed at the contact surface 382, and conductive attachment material 383 on the top conductive pads enables the module 200' to be physically and electrically connected to a system substrate (e.g., system substrate 610, FIG. 6).

Each of the signal and ground terminals 214, 216, 241-248, 261, 262, 264, 265 of FIGS. 2 and 3 may be replaced with interposer terminals such as the interposer terminal 491 depicted in FIG. 4. For example, as mentioned above, FIG. 4B illustrates a modified module 200' with interposer ground terminals 243', 244' positioned on both sides of power transistor die 234 according to an example embodiment. As with the embodiment illustrated in FIG. 4A, the interposer ground terminals 243', 244' (each having the structure of generic interposer terminal 491) are positioned in proximity to die 234, such that that an electrical length of an electrically conductive path (e.g., dashed-line path 487') between the ground contact for the die (e.g., the bottom-side source contact 434) through the thermal dissipation structure (e.g., structure 316), the RF ground layer (e.g., layer 302), any intervening vias (e.g., via 444), the ground terminal pad (e.g., pad 344), and the height of the interposer ground terminal (e.g., terminal 244') is less than about lambda/5 ($\lambda/5$), in some embodiments, or less than about lambda/16 ($\lambda/16$), in other embodiments.

As also mentioned above, FIG. 5B illustrates a modified module 200" in which interposer ground terminals 265', 266' positioned on both sides of an interposer signal terminal 214' provide a GSG (ground-signal-ground) terminal structure 264' for the RF output of the module 200". A similar structure may be implemented for the RF input of the module 200".

Another embodiment is illustrated in FIG. 5C, which is a cross-sectional, side view of another modified version 200''' of the power amplifier module 200 of FIG. 2 along line 5-5, which once again depicts a GSG terminal 264" with interposer ground terminals 265", 266" positioned on both sides of an interposer signal terminal 214" according to another example embodiment. The primary difference between the embodiments of FIGS. 5B and 5C is that the multiple interposer terminals 265', 266', 214' that produce the GSG terminal structure 264' in FIG. 5B is replaced, in FIG. 5C, with a single, multiple-terminal interposer 591. More specifically, the multiple-terminal interposer 591 includes a dielectric body 592 (e.g., formed from FR-4, ceramic, or other suitable dielectric materials) with top and bottom surfaces 593, 594, and multiple conductive vias 595-1, 595-2, 595-3 extending through the dielectric body 592 between its top and bottom surfaces 593, 594. In addition, conductive pads 596-1, 596-2, 596-3, 597-1, 597-2, 597-3 are deposited on the top and bottom surfaces 593, 594 in contact with first and second ends, respectively, of each of the multiple conductive vias 595-1, 595-2, 595-3. Once again, each of the conductive vias 595-1, 595-2, 595-3 may have circular, square, rectangular, or bar cross-sectional shapes. Either way, the combination of pad 596-1, via 595-1, and pad 597-1 correspond to a first ground interposer terminal 265", the combination of pad 596-2, via 595-2, and pad 597-2 correspond to a signal interposer terminal 214", and the combination of pad 596-3, via 595-3, and pad 597-3 correspond to a second ground interposer terminal 266". The first and second ground interposer terminals 265", 266" and the signal interposer terminal 214" produce yet another embodiment of a GSG terminal structure 264".

As indicated previously, to incorporate embodiments of power amplifier module 200 into a larger electrical system (e.g., a final stage amplifier of a cellular base station), one surface of the power amplifier module 200 is physically and electrically coupled to a system substrate, and a heat sink is attached to the opposite surface of the power amplifier module 200. To illustrate the integration of power amplifier module 200 into such a system, reference is now made to FIG. 6, which is a cross-sectional, side view of an amplifier system 600 that includes the power amplifier module 200 of FIG. 2 coupled to a system substrate 610 and a heat sink 616, in accordance with an example embodiment.

The RF system 600 generally includes a system substrate 610, power amplifier module 200 (or module 200', 200", 200'''), and a heat sink 616. According to an embodiment, the system substrate 610 includes a multi-layer printed circuit board (PCB) or other suitable substrate. The system substrate 610 has a top surface 609 (also referred to as a "mounting surface"), an opposed bottom surface 611. As depicted in FIG. 6, the system substrate 610 includes a plurality of dielectric layers 605, 606, 607 (e.g., formed from FR-4, ceramic, or other PCB dielectric materials), in an alternating arrangement with a plurality of conductive layers 601, 602, 603, where the top surface 609 of the system substrate 610 is defined by a patterned conductive layer 601. It should be noted that, although system substrate 610 is shown to include three dielectric layers 605-607 and three conductive layers 601-603, other embodiments of a system substrate may include more or fewer dielectric layers and/or conductive layers.

Each of the various conductive layers 601-603 may have a primary purpose, and also may include conductive features that facilitate signal and/or voltage/ground routing between other layers. Although the description below indicates a primary purpose for each of the conductive layers 601-603, it should be understood that the layers (or their functionality) may be arranged differently from the particular arrangement best illustrated in FIG. 6 and discussed below.

For example, in an embodiment, the patterned conductive layer 601 at the mounting surface 609 of the system substrate 610 may primarily function as a signal conducting layer. More specifically, layer 601 includes a plurality of conductive features (e.g., conductive pads and traces) which serve as attachment points for module 200, an input RF connector 691, and an output RF connector 692. Each of RF connectors 691, 692 may, for example, be coaxial connectors with a central signal conductor 693 and an outer ground shield 694. According to an embodiment, the signal conductor 693 of RF input connector 691 is electrically coupled to a first conductive trace 612 of layer 601, which in turn is coupled to input terminal 212 of module 200, as described in more detail below. In addition, the signal conductor 693 of RF output connector 692 is electrically coupled to a second conductive trace 614 of layer 601, which in turn is coupled to an output terminal (e.g., terminal 214, FIG. 2) of module 200. The ground shields 694 of connectors 691, 692 are electrically coupled to additional traces (not numbered), which in turn are electrically coupled to a system ground layer 602 of the system substrate 610 through conductive vias 695 that extend between layers 601 and 602.

As just indicated, conductive layer 602 functions as a system ground layer. In addition to being electrically coupled to the ground shields 694 of connectors 691, 692, the system ground layer 602 also is electrically coupled through additional conductive vias 696 to additional ground pads 641 on the mounting surface 609. As will be described in more detail below, the additional ground pads 641 are physically and electrically coupled to the various ground terminals (e.g., terminals 241-248, 261, 262, 265, 266) of module 200.

Module 200 (or any of modules 200', 200", 200'") is coupled to the mounting surface 609 of system substrate 610 in an inverted (or "flipped") orientation from the orientations depicted in FIGS. 3-5. More specifically, module 200 is coupled to the system substrate 610 so that the contact surface 382 of the module 200 and the mounting surface 609 of the system substrate 610 face each other. In order to connect module 200 to system substrate 610, each of the terminals of module 200 (e.g., terminals 212, 214, 241-248, 261, 262, 265, 266, FIG. 2) are aligned and brought into contact with corresponding pads (e.g., pads 612, 614, 641) on the mounting surface 609 of system substrate 610. In embodiments in which conductive attachment material 383 is disposed on the exposed ends of the module terminals, the conductive attachment material 383 is reflowed or otherwise cured to physically connect the module terminals to their corresponding pads on the mounting surface 609 of the module substrate 610. In other embodiments, conductive attachment material also or alternatively may be disposed on the conductive pads (e.g., pads 612, 614, 641) of the system substrate 610, and an appropriate reflow or curing process may be performed to connect the module 200 to the system substrate 610.

According to an embodiment, a heat sink 616 is physically and thermally coupled to the heat sink attachment surface 211 of the power amplifier module 200, and more specifically to conductive layer 304 and/or the surface 318 of the embedded heat dissipation structure 316 of module 200. The heat sink 616 is formed from a thermally-conductive material, which also may be electrically-conductive. For example, the heat sink 616 may be formed from copper or another bulk conductive material. To couple the heat sink 616 to the power amplifier module 200, a thermally conductive material 698 (e.g., thermal grease) may be dispensed on the heat sink attachment surface 211 of the module 200 (and/or on the surface 318 of the heat dissipation structure 316) and/or the heat sink 616, and the heat sink 616 may be brought into contact with the heat sink attachment surface 211. The heat sink 616 may then be clamped, screwed, or otherwise secured in place.

During operation of RF system 600, input RF signals are provided through the RF input terminal 691 and trace/pad 612 to an RF input terminal 212 at the contact surface 382 of the power amplifier module 200. The input RF signals are conveyed through terminal 212 and additional components (e.g., power splitter 220, FIG. 2) to the power transistor dies 233, 234, 253, 254, which amplify the input RF signal as discussed previously. The amplified output RF signals are produced at output terminal 214 (FIGS. 2, 5A, 5B, 5C), which is electrically coupled to trace/pad 614, and to the RF output terminal 692.

According to an embodiment, a ground path is provided between each of the power transistor dies 233, 234, 253, 254 and the system ground layer 602. For example, for dies 233, 234 shown in FIG. 6, the ground path for each die 233, 234 includes a first conductive ground path (e.g., ground path 487, 487', FIGS. 4A, 4B), which extends from the ground contact for the die (e.g., the bottom-side source contact 434, FIGS. 4A, 4B) through a portion of the thermal dissipation structure 316, the RF ground layer 302 of the module 200, any intervening vias (e.g., vias 442, 444, FIGS. 3, 4A, 4B), a ground terminal pad (e.g., pads 342, 344, FIGS. 3, 4A, 4B), and one or more ground terminals (e.g., terminals 241-244, FIGS. 2, 3, 4A, 4B). As shown in FIG. 6 with dashed-line paths 687, the ground path continues through one or more ground pads 641 on the mounting surface 609 of the system substrate 610 and one or more ground vias 696 to the system ground layer 602.

As discussed in detail previously, the ground terminals 241-244 of the module 200 are placed in close proximity to the power transistor dies 233, 234, 253, 254, which results in a relatively short ground return path for the module 200. Desirably, the entire electrical length of the ground path between the ground contact for each die 233, 234, 253, 254 and the system ground layer 602 is less than about lambda/5 (λ/5), in some embodiments, or less than about lambda/16 (λ/16), in other embodiments.

During operation, significant thermal energy (heat) may be produced by the power transistor(s) within the power transistor dies 233, 234, 253, 254. As indicated by arrows 699, the thermal energy produced by the power transistor(s) is conveyed through the thermal dissipation structure 316 to the heat sink 616, which effectively dissipates the heat to the ambient atmosphere. Accordingly, the thermal dissipation structure 316 provides two functions: 1) the function of conveying heat produced by the power transistor dies 233, 234, 253, 254 to the heat sink 616; and 2) the function of electrically coupling the ground contacts of the dies 233, 234, 253, 254 to system ground.

Figure 6:
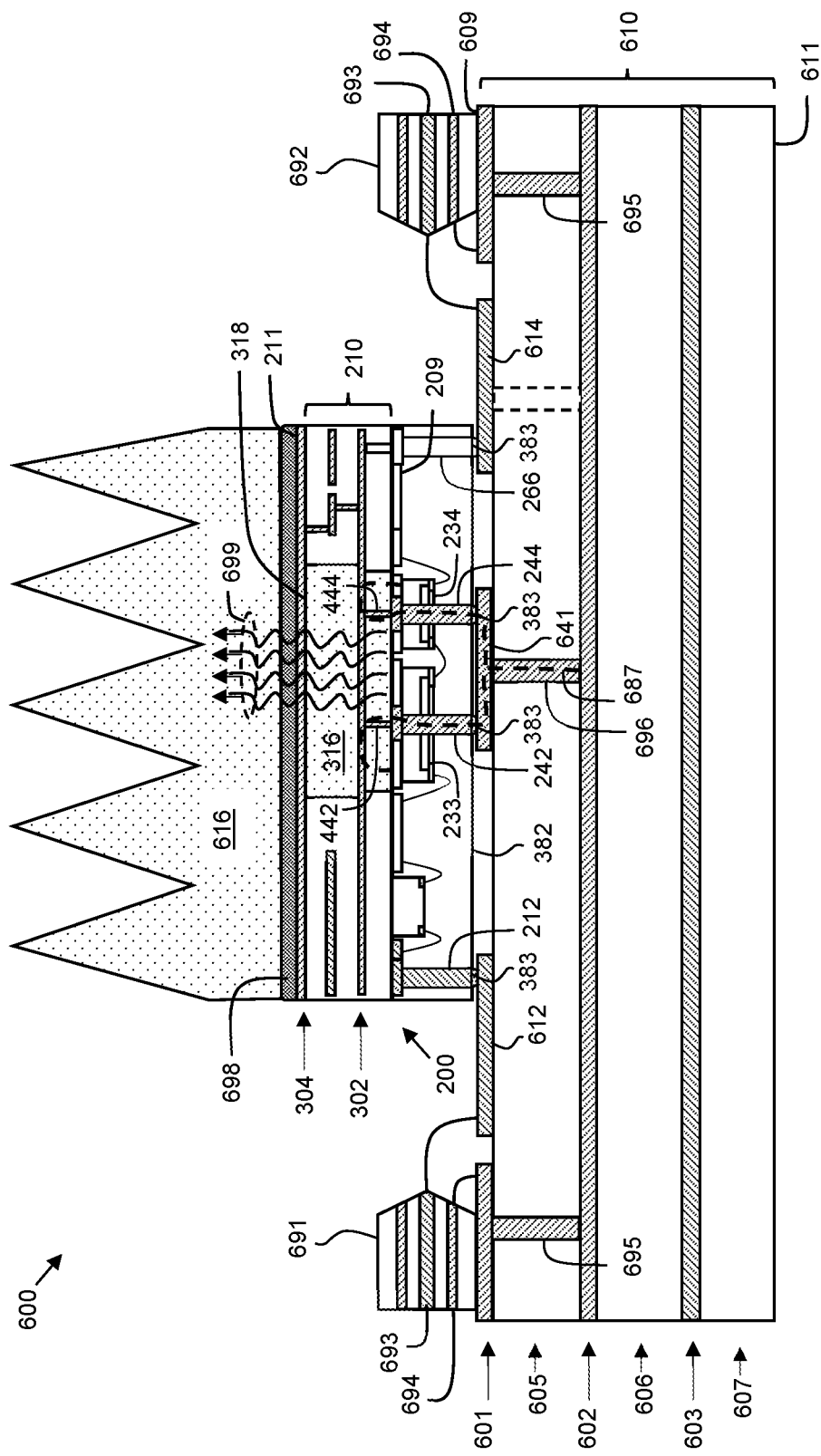
FIG. 6 is a cross-sectional, side view of an amplifier system that includes the power amplifier module of FIG. 2 coupled to a system substrate and a heat sink, in accordance with an example embodiment.
Figure 7:
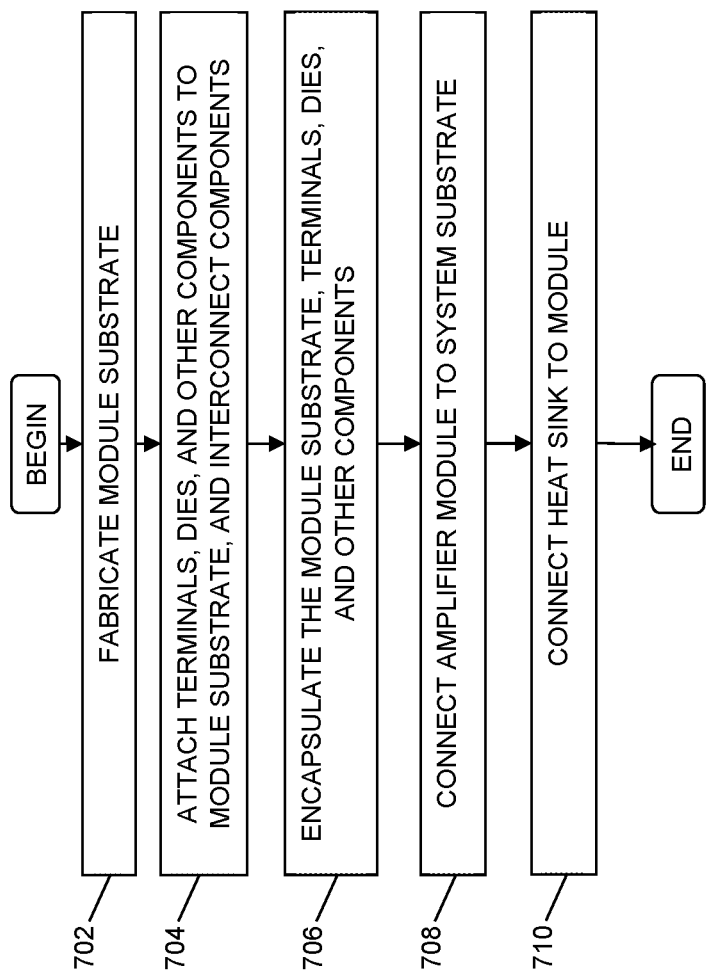
FIG. 7 is a flowchart of a method for fabricating a power amplifier module and an amplifier system, in accordance with an example embodiment.

FIG. 7 is a flowchart of a method of fabricating a power amplifier module (e.g., power amplifier module 200, FIG. 2) and assembling the power amplifier module into an RF system (e.g., RF system 600, FIG. 6), in accordance with an example embodiment. The method may begin, in block 702, by fabricating a multi-layer module substrate (e.g., module substrate 210, FIGS. 2, 3) using known techniques. As discussed previously, a plurality of pads and traces are formed from portions of a patterned conductive layer (e.g., layer 301, FIG. 3) at a mounting surface of the module substrate. In block 704, various terminals (e.g., terminals 212, 214, 241-248, 262, 263, 265, 266, FIG. 2), power transistor dies (e.g., dies 233, 234, 253, 254, FIG. 2), and other components (e.g., power splitter 220, FIG. 2) are connected to the mounting surface of the module substrate, and additional connections (e.g., wirebonds) are made between the power transistor dies and components. In block 706, the module substrate, terminals, dies, and other components are encapsulated (e.g., with encapsulant material 380, FIG. 3), to define a contact surface 382 at which distal ends of the terminals are exposed.

In block 708, the module 200 is inverted, and the module terminals are aligned with and brought into contact with corresponding pads (e.g., pads 612, 614, 641, FIG. 6) on the mounting surface of a system substrate (e.g., system substrate 610, FIG. 6). Conductive attachment material (e.g., material 383, such as solder or conductive adhesive) is reflowed, cured, or otherwise processed to produce a mechanical and electrical connection between the module terminals and the system substrate pads. This establishes signal and ground paths between the module and the system substrate.

Finally, in block 710, a heat sink (e.g., heat sink 616, FIG. 6) is attached to the heat sink attachment surface (e.g., surface 211, FIGS. 3, 6) of the module substrate. For example, the heat sink may be attached to the module substrate using a thermally conductive material (e.g., material 698, such as thermal grease), clamps, screws, and/or other attachment means. The method then ends.

An embodiment of an amplifier module includes a module substrate with a mounting surface, a signal conducting layer, a ground layer, and a first ground terminal pad at the mounting surface. A thermal dissipation structure extends through the module substrate. A ground contact of a power transistor die is coupled to a first surface of the thermal dissipation structure. Encapsulant material covers the mounting surface of the module substrate and the power transistor die, and a surface of the encapsulant material defines a contact surface of the amplifier module. A first ground terminal is embedded within the encapsulant material. The first ground terminal has a proximal end coupled to the first ground terminal pad, and a distal end exposed at the contact surface. The first ground terminal is electrically coupled to the ground contact of the power transistor die through the first ground terminal pad, the ground layer of the module substrate, and the thermal dissipation structure.

An embodiment of an amplifier system includes a system substrate and an amplifier module. The system substrate has a first mounting surface, a first signal conducting layer, a first ground layer, and a ground pad at the first mounting surface, where the ground pad is electrically coupled to the first ground layer. The amplifier module has a contact surface and a heat sink attachment surface. The amplifier module is coupled to the system substrate with the mounting surface of the system substrate facing the contact surface of the amplifier module. The amplifier module further includes a module substrate with a second mounting surface, a second signal conducting layer, a second ground layer, and a ground terminal pad at the second mounting surface. In addition, the amplifier module includes a thermal dissipation structure extending through the module substrate. The thermal dissipation structure has a first surface and a second surface, where the first surface is exposed at the second mounting surface of the module substrate. In addition, the amplifier module includes a power transistor die with a ground contact, where the ground contact is coupled to the first surface of the thermal dissipation structure. Encapsulant material covers the second mounting surface of the module substrate and the power transistor die, where a surface of the encapsulant material defines the contact surface of the amplifier module. The amplifier module further includes a ground terminal embedded within the encapsulant material, where the ground terminal has a proximal end coupled to the ground terminal pad, and a distal end exposed at the contact surface, and where the ground terminal is electrically coupled to the ground contact of the power transistor die through the ground terminal pad, the second ground layer of the module substrate, and the thermal dissipation structure.

An embodiment of a method of fabricating a power amplifier includes coupling a power transistor die to a thermal dissipation structure that extends through a module substrate, where the module substrate has a first mounting surface, a first signal conducting layer, a first ground layer, and a first ground terminal pad at the first mounting surface. A first surface of the thermal dissipation structure is exposed at the first mounting surface of the module substrate. The power transistor die has a ground contact, where the ground contact is coupled to the first surface of the thermal dissipation structure. The method further includes coupling a proximal end of a first ground terminal to the first ground terminal pad of the module substrate, and covering the first mounting surface of the module substrate and the power transistor die with an encapsulant material to form an amplifier module. A surface of the encapsulant material defines a contact surface of the amplifier module, a distal end of the first ground terminal is exposed at the contact surface, and the first ground terminal is electrically coupled to the ground contact of the power transistor die through the first ground terminal pad, the ground layer of the module substrate, and the thermal dissipation structure.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier module comprising:
a module substrate with a mounting surface, a signal conducting layer, a ground layer, and a first ground terminal pad at the mounting surface;
a thermal dissipation structure extending through the module substrate, wherein the thermal dissipation structure has a first surface and a second surface, wherein the first surface is exposed at the mounting surface of the module substrate;
a power transistor die with a ground contact, wherein the ground contact is coupled to the first surface of the thermal dissipation structure;
encapsulant material covering the mounting surface of the module substrate and the power transistor die, wherein a surface of the encapsulant material defines a contact surface of the amplifier module; and
a first ground terminal embedded within the encapsulant material, wherein the first ground terminal has a proximal end coupled to the first ground terminal pad, and a distal end exposed at the contact surface, and wherein the first ground terminal is electrically coupled to the ground contact of the power transistor die through the first ground terminal pad, the ground layer of the module substrate, and the thermal dissipation structure.

2. The amplifier module of claim 1, wherein the thermal dissipation structure includes a conductive structure selected from a metallic coin and a set of thermal vias.

3. The amplifier module of claim 1, wherein the ground layer of the module substrate contacts the thermal dissipation structure.

4. The amplifier module of claim 1, wherein the first ground terminal comprises a conductive pillar.

5. The amplifier module of claim 1, wherein the first ground terminal comprises:
an interposer terminal that includes a dielectric body with a top surface and a bottom surface, and a conductive via extending between the top and bottom surfaces of the dielectric body.

6. The amplifier module of claim 5, wherein the first ground terminal further comprises:
a first conductive pad on the top surface of the dielectric body and connected to a first end of the conductive via, wherein the first conductive pad corresponds to the distal end of the first ground terminal; and
a second conductive pad on the bottom surface of the dielectric body and connected to a second end of the conductive via, wherein the second conductive pad corresponds to the proximal end of the first ground terminal.

7. The amplifier module of claim 1, wherein a distance between the power transistor die and the first ground terminal is less than a width of the power transistor die.

8. The amplifier module of claim 1, wherein an electrical length of an electrically conductive path from the ground contact through the thermal dissipation structure, the ground layer, the first ground terminal pad, and the first ground terminal is less than lambda/5.

9. The amplifier module of claim 1, wherein:
the module substrate also includes a signal terminal pad, a second ground terminal pad, and a third ground terminal pad at the mounting surface, wherein the signal terminal pad is electrically connected through the signal conducting layer to one of an input and an output of the power transistor die, and the second and third ground terminal pads are adjacent to the signal terminal pad; and
the amplifier module further includes
a signal terminal embedded within the encapsulant material, wherein the signal terminal has a proximal end coupled to the signal terminal pad, and a distal end exposed at the contact surface,
a second ground terminal embedded within the encapsulant material, wherein the second ground terminal has a proximal end coupled to the second ground terminal pad, and a distal end exposed at the contact surface, and
a third ground terminal embedded within the encapsulant material, wherein the third ground terminal has a proximal end coupled to the third ground terminal pad, and a distal end exposed at the contact surface, and wherein the signal terminal, the second ground terminal, and the third ground terminal form a ground-signal-ground terminal structure.

10. An amplifier system comprising:
a system substrate with a first mounting surface, a first signal conducting layer, a first ground layer, and a ground pad at the first mounting surface, wherein the ground pad is electrically coupled to the first ground layer; and
an amplifier module with a contact surface and a heat sink attachment surface, wherein the amplifier module is coupled to the system substrate with the mounting surface of the system substrate facing the contact surface of the amplifier module, and wherein the amplifier module further includes
a module substrate with a second mounting surface, a second signal conducting layer, a second ground layer, and a first ground terminal pad at the second mounting surface, a thermal dissipation structure extending through the module substrate, wherein the thermal dissipation structure has a first surface and a second surface, wherein the first surface is exposed at the second mounting surface of the module substrate, a power transistor die with a ground contact, wherein the ground contact is coupled to the first surface of the thermal dissipation structure, encapsulant material covering the second mounting surface of the module substrate and the power transistor die, wherein a surface of the encapsulant material defines the contact surface of the amplifier module, and a first ground terminal embedded within the encapsulant material, wherein the first ground terminal has a proximal end coupled to the first ground terminal pad, and a distal end exposed at the contact surface, and wherein the first ground terminal is electrically coupled to the ground contact of the power transistor die through the first ground terminal pad, the second ground layer of the module substrate, and the thermal dissipation structure.

11. The amplifier system of claim 10, wherein the distal end of the first ground terminal is coupled to the ground pad of the system substrate.

12. The amplifier system of claim 10, wherein an electrical length of an electrically conductive path from the ground contact through the thermal dissipation structure, the second ground layer of the amplifier module, the first ground terminal pad, the first ground terminal, the ground pad of the system substrate, and to the first ground layer of the system substrate is less than lambda/5.

13. The amplifier system of claim 1, wherein:

the module substrate also includes a signal terminal pad, a second ground terminal pad, and a third ground terminal pad at the second mounting surface, wherein the signal terminal pad is electrically connected through the second signal conducting layer to one of an input and an output of the power transistor die, and the second and third ground terminal pads are adjacent to the signal terminal pad; and the amplifier module further includes a signal terminal embedded within the encapsulant material, wherein the signal terminal has a proximal end coupled to the signal terminal pad, and a distal end exposed at the contact surface and electrically coupled to the first signal conducting layer of the system substrate, a second ground terminal embedded within the encapsulant material, wherein the second ground terminal has a proximal end coupled to the second ground terminal pad, and a distal end exposed at the contact surface and electrically coupled to the first ground layer of the system substrate, and a third ground terminal embedded within the encapsulant material, wherein the third ground terminal has a proximal end coupled to the third ground terminal pad, and a distal end exposed at the contact surface and electrically coupled to the first ground layer of the system substrate, and wherein the signal terminal, the second ground terminal, and the third ground terminal form a ground-signal-ground terminal structure.

14. The amplifier system of claim 10, further comprising:
a heat sink coupled to the heat sink attachment surface.

15. A method of fabricating a power amplifier, the method comprising:

coupling a power transistor die to a thermal dissipation structure that extends through a module substrate, wherein the module substrate has a first mounting surface, a first signal conducting layer, a first ground layer, and a first ground terminal pad at the first mounting surface, a first surface of the thermal dissipation structure is exposed at the first mounting surface of the module substrate, and the power transistor die has a ground contact, wherein the ground contact is coupled to the first surface of the thermal dissipation structure;

coupling a proximal end of a first ground terminal to the first ground terminal pad of the module substrate; and covering the first mounting surface of the module substrate and the power transistor die with an encapsulant material to form an amplifier module, wherein a surface of the encapsulant material defines a contact surface of the amplifier module, a distal end of the first ground terminal is exposed at the contact surface, and the first ground terminal is electrically coupled to the ground contact of the power transistor die through the first ground terminal pad, the ground layer of the module substrate, and the thermal dissipation structure.

16. The method of claim 15, further comprising:
coupling the amplifier module to a system substrate with a second mounting surface of the system substrate facing the contact surface of the amplifier module, wherein the system substrate further includes a second signal conducting layer, a second ground layer, and a ground pad at the second mounting surface, wherein the ground pad is electrically coupled to the second ground layer, and wherein the distal end of the first ground terminal is coupled to the ground pad.

17. The method of claim 16, wherein the amplifier module has a heat sink attachment surface opposite the contact surface, and the method further comprises:

coupling a heat sink to the heat sink attachment surface of the amplifier module.

18. The method of claim 16, wherein the module substrate further includes, at the first mounting surface, a signal terminal pad, a second ground terminal pad, and a third ground terminal pad, and wherein the method further includes:

coupling a proximal end of a signal terminal to the signal terminal pad;

coupling a proximal end of a second ground terminal to the second ground terminal pad; and coupling a proximal end of a third ground terminal to the third terminal pad, wherein the signal terminal, the second ground terminal, and the third ground terminal form a ground-signal-ground terminal structure, and wherein distal ends of the signal terminal, the second ground terminal, and the third ground terminal are exposed at the contact surface of the module substrate.

19. The method of claim 18, further comprising:
coupling the amplifier module to a system substrate with a second mounting surface of the system substrate facing the contact surface of the amplifier module, wherein the system substrate further includes a second signal conducting layer, a second ground layer, and first, second, and third ground pads at the second mounting surface, and wherein the first, second, and third ground pads are electrically coupled to the second ground layer, the distal end of the first ground terminal is coupled to the first ground pad,
the distal end of the second ground terminal is coupled to the second ground pad,
the distal end of the third ground terminal is coupled to the third ground pad, and
the distal end of the end of the signal terminal is coupled to the second signal conducting layer.

* * * * *